United States Patent
Bormans et al.

[11] Patent Number: 5,986,270
[45] Date of Patent: Nov. 16, 1999

[54] PARTICLE-OPTICAL APPARATUS INCLUDING A LOW-TEMPERATURE SPECIMEN HOLDER

[75] Inventors: Bernardus J. M. Bormans; Alan F. De Jong, both of Eindhoven, Netherlands; Karel D. Van Der Mast, Portland, Oreg.; Raymond Wagner, Eindhoven, Netherlands; Peter E. S. J. Asselbergs, Cambridge, United Kingdom

[73] Assignee: U.S. Philips Corporation, New York, N.Y.

[21] Appl. No.: 08/990,870
[22] Filed: Dec. 15, 1997
[30] Foreign Application Priority Data
Dec. 23, 1996 [EP] European Pat. Off. .............. 96203667
[51] Int. Cl.⁶ ........................................... H01J 37/20
[52] U.S. Cl. .................. 250/442.11; 250/443.1; 250/311
[58] Field of Search ............................. 250/442.11, 443.1, 250/311, 310

[56] References Cited

U.S. PATENT DOCUMENTS

| | | | |
|---|---|---|---|
| 3,761,709 | 9/1973 | Hasegawa et al. ................. | 250/442.11 |
| 4,227,080 | 10/1980 | Okura et al. ........................ | 250/442.11 |
| 4,591,722 | 5/1986 | Biddlecombe et al. ............. | 250/443.1 |
| 5,039,864 | 8/1991 | Kondo ................................ | 250/442.11 |
| 5,089,708 | 2/1992 | Asselbergs ......................... | 250/442.11 |

*Primary Examiner*—Keit T. Nguyen
*Attorney, Agent, or Firm*—Fulbright & Jaworski, LLP

[57] ABSTRACT

In an electron microscope it is sometimes important that specimens can be studied at a very low temperature (for example, that of liquid helium). In the case of known specimen holders the specimen is cooled by supplying the cooling medium via a bore in the specimen holder; this causes thermal drift of the removed specimen holder each time when a specimen is exchanged, and also an acoustic coupling (i.e. transfer of vibrations) exists with the dewar vessel connected to the specimen holder. In accordance with the invention, the specimen is arranged on the end 20 of the specimen holder 7 by means of a separate transport unit 13, 36 so that it is not necessary to remove the specimen holder 7 in order to exchange a specimen, with the result that the specimen holder is not heated. Moreover, the coupling to the cold source 22, 28 can take place via a flexible cooling conduit 30 which extends directly to the end 20 to be cooled and may be permanently connected thereto, thus avoiding the transfer of vibrations.

14 Claims, 2 Drawing Sheets

PARTICLE-OPTICAL APPARATUS INCLUDING A LOW-TEMPERATURE SPECIMEN HOLDER

The invention relates to a particle-optical apparatus, including a manipulable specimen holder for supporting a specimen being studied in the apparatus, and a cooling device for cooling the specimen, which cooling device is provided with a cold source which is connected to the specimen via cooling conduit means.

Such a particle-optical apparatus comprising a specimen holder is known from U.S. Pat. No. 4,591,722. Specimen holders are customarily used in a particle-optical apparatus (generally speaking an electron microscope) in order to move the specimen to be studied in the electron microscope to the correct position within the apparatus and to manipulate it in the position and orientation required for the examination. A specific requirement imposed on such a specimen holder is that its end supporting the specimen must be displaceable in three mutually perpendicular directions (i.e. in the direction of the optical axis of the apparatus and in two directions in the plane perpendicular thereto) with a maximum displacement of the order of magnitude of 1 mm. Moreover, it should be possible to tilt the specimen through an angle of the order of magnitude of 60° about two mutually perpendicular axes.

For some specimens, notably biological specimens, it is important that it is possible to study them at a very low temperature. Temperatures in this respect are to be understood to mean temperatures in the vicinity of that of liquid nitrogen or even liquid helium. In order to enable cooling of the specimen, the specimen holder disclosed in the cited patent specification is provided with a cooling device for cooling the specimen. This cooling device includes a bore in the direction of the longitudinal axis of the specimen holder via which nitrogen gas of a temperature of approximately $-190°$ C. is conducted. The thermal connection between the specimen and the bore conducting the nitrogen is formed by a copper heat exchanger and a solid copper bar which contacts the heat exchanger and whose other end is also in thermal contact with the end of the specimen holder supporting the specimen. The known apparatus is thus provided with cooling conduit means (the heat exchanger and the bar) which establish the thermal contact between the specimen and the cold source (the bore conducting nitrogen).

A specimen holder of this kind has a number of drawbacks. A first drawback consists in that in order to exchange the specimen the entire specimen holder must be removed from the apparatus and subsequently introduced again. Immediately after introduction, the specimen holder and the parts connected thereto will not yet have reached a thermal equilibrium. As a result, thermal shrinkage or expansion of the materials will still occur, so that the specimen will exhibit a given drift relative to the irradiating electron beam. This means that in the case of a high-resolution TEM (i.e. a Transmission Electron Microscope having a resolution in the nanometer range) no high-resolution images can be formed for as long as there is not yet a thermal equilibrium. The availability of the apparatus is thus strongly reduced.

It is a second drawback of the known specimen holder that it must be connected to a storage vessel containing a cooling medium, for example liquid helium, which is situated outside the apparatus. This inevitably necessitates a strong mechanical coupling between the specimen holder (i.e. the specimen) and the storage vessel. The liquid in the storage vessel is in the boiling state during use, so that the liquid itself generates vibrations. Moreover, the storage vessel is acoustically coupled to the ambient atmosphere, so that the vessel takes up mechanical vibrations from the environment. All such disturbing effects are passed on to the specimen via the specimen holder, so that the maximum resolution that can be achieved by the apparatus is limited to a value which is substantially lower than the resolution that can be achieved in the case of a specimen holder which is not cooled.

It could be contemplated to eliminate the mechanical coupling between the storage vessel and the specimen. This should be realized by providing a flexible cooling conduit between the vessel and the specimen holder. However, this has the drawback that the cooling conduit itself must be suitably thermally insulated; this also holds for the connection of this conduit to the specimen holder which, however, is situated exactly in a location where other instruments for manipulating the specimen are mounted. Moreover, upon rotation of the specimen (notably through large angles) there is a risk that the cooling conduit comes into contact with the storage vessel as yet, so that vibrations are still passed on. Moreover, this solution is very problematic notably for liquid helium. Finally, the first mentioned problem of thermal drift still remains unsolved.

It is an object of the invention to provide an apparatus of the kind set forth in which a specimen can be studied at low temperatures, for example the temperature of liquid helium, without giving rise to the problem of thermal drift.

To achieve this, the particle-optical apparatus according to the invention is characterized in that it is provided with a transport unit for transporting the specimen to and from the specimen holder, which transport unit is mounted separately from the specimen holder.

The transport unit is mounted in a wall of the particle-optical apparatus in the vicinity of the location where the specimen holder is arranged, i.e. preferably at the same height in the wall of the column of the apparatus and diametrically opposite the specimen holder. This location of the transport unit offers the advantage that it is not necessary to modify the design of the apparatus, notably the optical aspects thereof, because the location of the optical elements in the particle-optical column is not influenced thereby. The transport unit sluices the specimen into and out of the evacuated space within the column of the apparatus and transports the specimen to and from the specimen holder within said space. The specimen itself need not yet have reached the desired final temperature, because it consists of only a small quantity of matter to be cooled, so that it can be readily cooled and does not cause noticeable heating of the specimen holder. During the transfer of the specimen from the transport unit to the specimen holder the thermal contact between the end of the specimen holder and the corresponding end of the transport unit can be limited by providing insulation of a transfer arm of the transport unit and/or by constructing this arm to be thin and/or by limiting the duration of the contact. It will thus be evident that the specimen holder itself need not be removed from the apparatus in order to exchange the specimen.

The cooling conduit means in a preferred embodiment of the invention are provided separately between the end of the specimen holder which is situated inside the apparatus and the cold source. The term "separately" in this context is to be understood to mean that the cooling conduit means are not connected to the specimen holder in any way other than the connection to the end of the specimen holder. As a result of this step, cooling takes place where cooling is indeed most desirable, i.e. in the direct vicinity of the specimen. Moreover, a higher degree of freedom is thus achieved in respect of mounting of equipment on the end of the specimen holder which is situated outside the apparatus.

The cooling conduit means in a further embodiment of the invention are permanently connected to the end of the specimen holder which is situated inside the apparatus. In this context a permanent connection is to be understood to mean a connection which need not be detached by the user of the apparatus during normal operation of the electron microscope. Thus, very intimate contact can be established between the cold source (for example, a cooling finger projecting through the wall of the column) and the end of the specimen holder, so that the thermal contact resistance between these two parts becomes negligibly small. It is also possible to establish this connection by shrinking a cooling conduit which is permanently connected to the cold finger onto said end, a ductile material, for example, indium, then being clamped in the joint.

The cooling conduit means in another embodiment of the invention include a flexible thermal conduit which is connected to the end of the specimen holder which is situated inside the apparatus. Such a conduit may be formed by a large number of parallel copper wires, a so-called litze cable. The use of such a flexible connection makes the transfer of vibrations from the cold source (a dewar vessel whereto cooling conduit means are coupled) impossible or in any case reduces it to such an extent that it becomes practically insignificant. Moreover, the use of such a flexible connection enables simple movement of the specimen holder with the required number of degrees of freedom, i.e. said three translations and said two rotations.

A further embodiment of the particle-optical apparatus according to the invention includes displacement means for displacing the flexible thermal conduit in such a manner that the displacement of the specimen holder relative to the flexible thermal conduit is reduced. It cannot be precluded that, despite its flexibility, said flexible thermal conduit still exerts inadmissible forces on the specimen holder. Therefore, it is useful to displace the flexible thermal conduit in approximately the same way upon displacement of the specimen holder, so that no forces can be induced by deformation of the conduit.

The displacement means in a further embodiment of the invention include a rotation unit which is separate from the specimen holder and whose axis of rotation substantially coincides with the axis of rotation of the specimen holder, one end of the flexible thermal conduit being connected to said rotation unit whereas its other end is connected to the end of the specimen holder which is situated inside the apparatus. Should the flexible thermal conduit exert inadmissible forces on the specimen holder as mentioned above, they will become manifest first upon rotation of the specimen holder, because a rotation of the order of magnitude of 60° is accompanied by comparatively large displacements. A separate rotation unit can thus be provided which is controlled in known manner so that the rotation of this unit follows that of the specimen holder without forces being exerted on the specimen holder. This is possible, for example by utilizing a servo mechanism which measures the angular rotation of the specimen holder and controls a motor of the rotation unit. In that case no or only negligibly small deformation of the conduit will occur.

The specimen holder in a further embodiment of the invention is provided with a thermally insulating part between its end which is situated inside the apparatus and its end which is situated outside the apparatus. The heat flow through the specimen holder is thus reduced, and hence also the heat flow to the specimen, so that the effect of any thermal resistances in the path from the cold source to the specimen is reduced.

The invention will be described in detail hereinafter with reference to the Figures in which corresponding reference numerals denote corresponding elements; therein:

Figure 1:
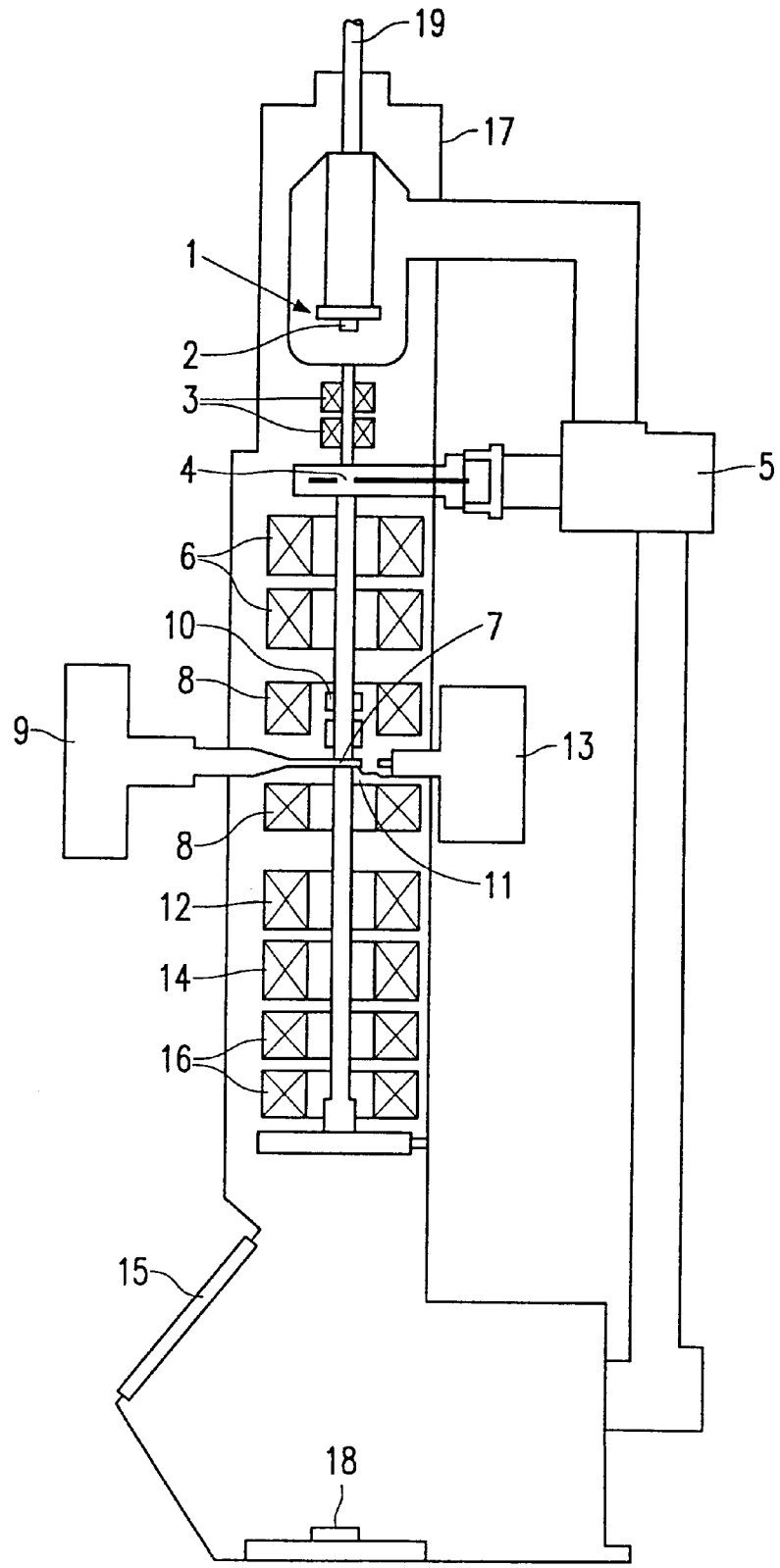
FIG. 1 shows a particle-optical apparatus in accordance with the invention in the form of an electron microscope.

The electron microscope shown in FIG. 1 includes an electron source 1 with an electron-emissive element 2, a beam alignment system 3, a beam diaphragm 4, a condenser lens 6, an objective lens 8, a beam scanning system 10, an object space 11, a diffraction lens 12, an intermediate lens 14, a projection lens 16 and an electron detector 18. The objective lens 8, the intermediate lens 14 and the projection lens 16 together constitute an imaging lens system. The above elements are accommodated in a housing 17 with an electrical supply lead 19 for the electron source, a viewing window 15 and a vacuum pumping device 5. In the object space 11 there is arranged a specimen holder 7 which is coupled to a control unit 9 for moving the specimen holder 7. The specimen holder has been introduced via an opening in the housing 17 of the apparatus. A loading/unloading unit 13 has been introduced via another opening in the housing of the apparatus which is situated opposite the opening for the specimen holder. There is also provided a cooling device for cooling the specimen; the cooling device is not shown in FIG. 1, but will be described with reference to the FIGS. 2, 3 and 4.

Figure 2:
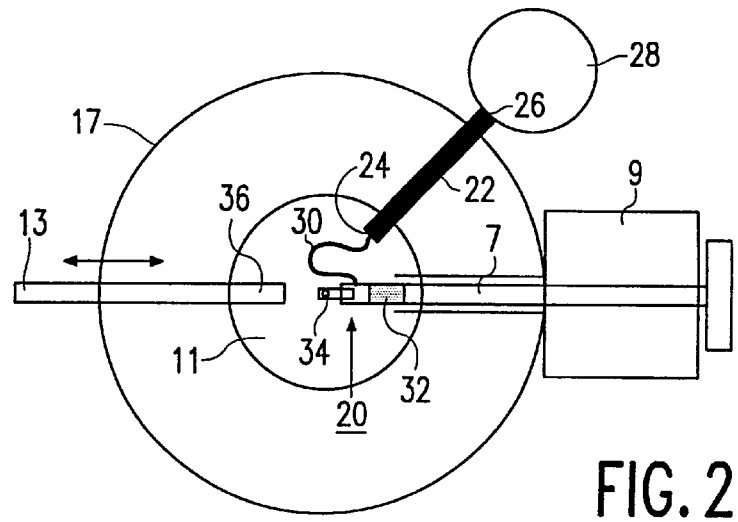
FIG. 2 is a diagrammatic horizontal cross-sectional view of a column of an electron microscope as shown in FIG. 1, provided with a first embodiment of a cooled specimen holder accordpg to the invention.

FIG. 2 is a more detailed diagrammatic horizontal cross-sectional view of the column of the electron microscope shown in FIG. 1. The housing 17 of the electron microscope encloses the object space 11 which accommodates the end 20 of the specimen holder 7 which is situated in the apparatus. The object space 11 also accommodates a part of a transport unit 13 which is only diagrammatically shown in FIG. 2. Finally, the object space 11 accommodates one end 24 of a cooling finger 22, the other end 26 of which is in contact with the contents of a dewar vessel 28, for example with liquid helium. The end 24 of the cooling finger 22 is provided with a flexible cooling conduit 30, the other end of which is connected to the end 20 of the specimen holder 7. A thermal insulator 32 is provided between the end 20 and the remainder of the specimen holder 7, which insulator counteracts a heat flow from outside of the column to the specimen 34 via the specimen holder. The end of the specimen holder which is situated outside the column is provided with a control unit 9 for moving (translating and rotating) the specimen holder 7.

The cooled specimen holder shown in FIG. 2 is used as follows during operation. The specimen holder 7 is moved to its position in which it is retained during normal operation of the electron microscope. A flexible thermal conduit 30 is connected to the end 20 of the specimen holder 7 by way of a joint which ensures suitable thermal contact between the conductor 30 and the end 20. The temperature of the end 20 is thus easily adjusted to the required low value via the cooling finger 22. A specimen to be studied is introduced into the transport unit 13 outside the column, after which the specimen is sluiced into the object space 11 in known manner (for example, as in the case of conventional specimen holders); it is then situated at an end 36 of an arm of the transport unit 13. The end 20 of the specimen holder 7 is subsequently brought into contact with the end 36 of the arm of the transport unit 13 in order to take over the specimen 34. Thus, it is not necessary to move the specimen holder 7 outside the column, with the result that the thermal equilibrium of the specimen holder will not be disturbed or only hardly so. Because the cooling conduit 30 can now be constructed so as to be flexible and constitutes a permanent connection, any vibrations produced by or via the dewar vessel 28 will not be transferred to the specimen 34, appropriate cooling nevertheless being ensured.

Figure 3:
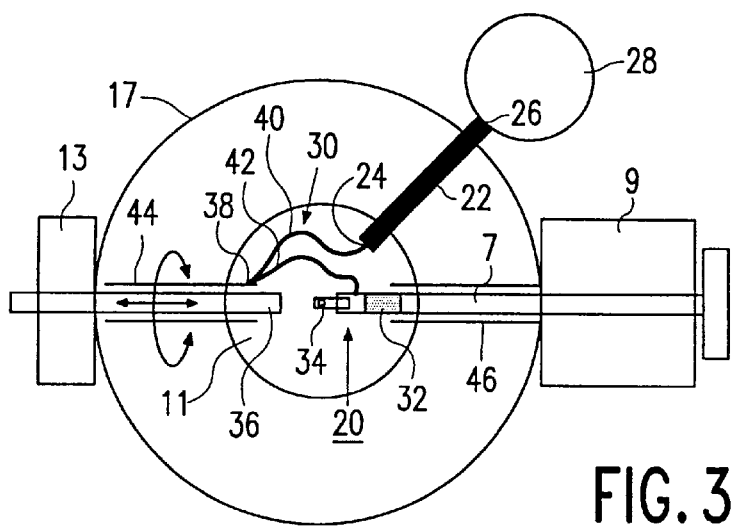
FIG. 3 is a diagrammatic horizontal cross-sectional view of a column of an electron microsce as shown in FIG. 1, provided with a second embodiment of a cooled specimen hoer according to the invention.

FIG. 3 shows a first alternative version of the cross-section of the column shown in FIG. 2. In this version the flexible cooling conduit 30 is not connected directly to the end 20 of the specimen holder 7 as in FIG. 2, but a first part 40 of the cooling conduit is provided between a part 44 of the transport unit 13 which rotates together with the specimen holder 7 and the end 24 of the cooling finger 22, a second part 42 of the cooling conduit being provided between the part 44 of the transport unit 13 which rotates together with the specimen holder 7 (which part is constructed, for example, as a rotatable sleeve) and the end 20 of the specimen holder. Because the part 44 follows the rotation of the specimen holder 7, the part 42 of the flexible cooling conductor 30 will hardly be deformed. The entire deformation caused by the rotation takes place within the part 40 of the cooling conduit. Consequently, the part 42 of the cooling conduit will not exert a noticeable force on the end 20 of the specimen holder 7.

Figure 4:
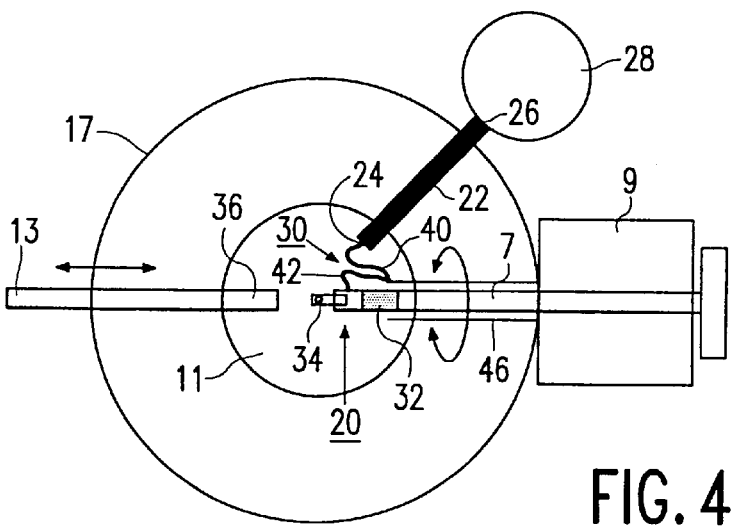
FIG. 4 is a diagrammatic horizontal cross-sectional view of a column of an electron microscope as shown in FIG. 1, provided with a third embodiment of a cooled specimen holder according to the invention.

FIG. 4 shows a further alternative version of the cross-section of the column shown in FIG. 2. In this version the flexible cooling conduit 30 is not connected directly to the end 20 of the specimen holder 7 as in FIG. 2, but a first part 40 of the cooling conduit is provided between a part 46 of the control unit 9 which rotates together with the specimen holder 7 and the end 24 of the cooling finger 22, a second part 42 of the cooling conduit being provided between the part 46 of the control unit 9 which rotates together with the specimen holder 7 (which part is constructed, for example as a rotatable sleeve) and the end 20 of the specimen holder. Because the part 46 follows the rotation of the specimen holder 7, the part 42 of the flexible cooling conduit 30 will hardly be deformed. The entire deformation caused by the rotation takes place within the part 40 of the cooling conduit. As a result, the part 42 of the cooling conduit will not exert a noticeable force on the end 20 of the specimen holder 7.

We claim:

1. A charged particle-optical apparatus, including:

a housing for maintaining a vacuum within the apparatus, a manipulable specimen holder for supporting a specimen being studied in the apparatus, and a cooling device for cooling the specimen, which cooling device is provided with a cold source which is thermally connected to the specimen via a cooling conduit, the cooling conduit being separate from the specimen holder where it penetrates the housing.

2. A charged particle-optical apparatus as claimed in claim 1, including a charged particle-optical column of optical elements, and a transport unit for transporting the specimen to and from the specimen holder, the transport unit being mounted separately from the specimen holder and arranged to transport the specimen to and from the specimen holder via a side wall of the charged particle-optical column.

3. A charged particle-optical apparatus as claimed in claim 2, wherein the transport unit transports the specimen by sluicing the specimen through the side wall of the charged particle-optical column.

4. A charged particle-optical apparatus as claimed in claim 1, in which the cooling conduit is permanently connected to the specimen holder near the end which is situated inside the apparatus.

5. A charged particle-optical apparatus as claimed in claim 1, in which the cooling conduit includes a flexible thermal conduit which is connected to the specimen holder near the end which is situated inside the apparatus.

6. A charged particle-optical apparatus as claimed claim 1, in which the specimen holder is provided with a thermally insulating part between its end which is situated inside the apparatus and its end which is situated outside the apparatus.

7. A charged particle-optical apparatus as claimed in claim 1 in which the specimen holder and the cooling conduit penetrate the housing at different locations.

8. A charged particle-optical apparatus as claimed in claim 1 in which the cooling conduit is not coaxial with the specimen holder where the cooling conduit penetrates the housing.

9. A charged particle-optical apparatus as claimed in claim 1 in which the region of the apparatus within the housing is not in vacuum communication with the cooling source.

10. A charged particle-optical apparatus as claimed in claim 1 further comprising a transport unit for transporting the specimen to and from the specimen holder, which transport unit is mounted separately from the specimen holder.

11. A charged particle-optical apparatus, including a manipulable specimen holder for supporting a specimen being studied in the apparatus, a cooling device for cooling the specimen, which cooling device is provided with a cold source which is connected to the specimen via a cooling conduit means including a flexible thermal conduit connected to the end of the specimen holder situated inside the apparatus, displacement means for displacing the flexible thermal conduit in such a manner that the displacement of the specimen holder relative to the flexible thermal conduit is reduced, and a transport unit for transporting the specimen to and from the specimen holder, which transport unit is mounted separately from the specimen holder.

12. A charged particle-optical apparatus as claimed in claim 11 in which the displacement means includes a rotation unit which is separate from the specimen holder and whose axis of rotation substantially coincides with the axis of rotation of the specimen holder, one end of the flexible thermal conduit being connected to said rotation unit whereas its other end is connected to the end of the specimen holder which is situated inside the apparatus.

13. A charged particle-optical apparatus including:

a housing for maintaining a vacuum within the apparatus, a manipulable specimen holder for supporting within the housing a specimen being studied in the apparatus, a cooling device for cooling the specimen, which cooling device is provided with a cold source which is thermally connected to the specimen via a cooling conduit that is provided separately between the specimen holder near the end which is situated inside the apparatus and the cold source, and a transport unit for transporting the specimen to and from the specimen holder, which transport unit is mounted separately from the specimen holder, the specimen penetrating the housing by moving through the transport unit toward the specimen holder, thereby reducing vibration and thermal disturbances by minimizing the mass that enters and leaves the housing.

14. A charged particle-optical apparatus including:

a housing for maintaining a vacuum within the apparatus, a manipulable specimen holder for supporting within the housing a specimen being studied in the apparatus, a cooling device for cooling the specimen, which cooling device is provided with a cold source which is thermally connected to the specimen via a cooling conduit that includes a flexible thermal conduit which is connected to the specimen holder near the end which is situated inside the housing and a transport unit for transporting the specimen to and from the specimen holder, which transport unit is mounted separately from the specimen holder, the specimen penetrating the housing by moving through the transport unit toward the specimen holder, thereby reducing vibration and thermal disturbances by minimizing the mass that enters and leaves the housing.

* * * * *